(12) United States Patent
Khlat

(10) Patent No.: US 12,381,524 B2
(45) Date of Patent: Aug. 5, 2025

(54) MULTI-VOLTAGE GENERATION CIRCUIT

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 472 days.

(21) Appl. No.: 17/946,170

(22) Filed: Sep. 16, 2022

(65) Prior Publication Data

US 2023/0118768 A1 Apr. 20, 2023

Related U.S. Application Data

(60) Provisional application No. 63/255,649, filed on Oct. 14, 2021.

(51) Int. Cl.
*H03F 1/30* (2006.01)
*H03F 3/24* (2006.01)

(52) U.S. Cl.
CPC ....... *H03F 3/245* (2013.01); *H03F 2200/129* (2013.01); *H03F 2200/451* (2013.01)

(58) Field of Classification Search
CPC .......................................................... H03F 1/30
USPC .................................... 330/297, 296, 285
See application file for complete search history.

(56) References Cited

U.S. PATENT DOCUMENTS

| | | |
|---|---|---|
| 5,982,233 A | 11/1999 | Hellmark et al. |
| 7,859,338 B2 | 12/2010 | Bajdechi et al. |
| 8,159,309 B1 | 4/2012 | Khlat et al. |
| 8,718,188 B2 | 5/2014 | Balteanu et al. |
| 8,912,769 B2 | 12/2014 | Lin et al. |
| 9,020,453 B2 | 4/2015 | Briffa et al. |
| 9,069,365 B2 | 6/2015 | Brown et al. |
| 9,148,090 B2 | 9/2015 | Tsuji |
| 9,172,331 B2 | 10/2015 | Nagasaku et al. |
| 9,231,527 B2 | 1/2016 | Hur et al. |
| 9,252,724 B2 | 2/2016 | Wimpenny |

(Continued)

FOREIGN PATENT DOCUMENTS

| | | |
|---|---|---|
| DE | 102019218816 A1 | 6/2020 |
| EP | 2254237 A2 | 11/2010 |

(Continued)

OTHER PUBLICATIONS

Notice of Allowance for U.S. Appl. No. 17/325,482, mailed Nov. 30, 2022, 8 pages.

(Continued)

*Primary Examiner* — Henry Choe
(74) *Attorney, Agent, or Firm* — Withrow & Terranova, P.L.L.C.

(57) ABSTRACT

A multi-voltage power generation circuit is disclosed. More specifically, the multi-voltage generation circuit includes multiple voltage modulation circuits that are configured to generate and maintain multiple modulated voltages. In a non-limiting example, the multiple modulated voltages can be used for amplifying multiple radio frequency (RF) signals concurrently. Contrary to using multiple direct-current (DC) to DC (DC-DC) converters for generating the multiple modulated voltages, the voltage modulation circuits are configured to share a single current modulation circuit based on time-division. By sharing a single current modulation circuit among the multiple voltage modulation circuits, it is possible to concurrently support multiple load circuits (e.g., power amplifier circuits) with significantly reduced footprint.

20 Claims, 5 Drawing Sheets

(56) References Cited

U.S. PATENT DOCUMENTS

| | | | |
|---|---|---|---|
| 9,350,299 | B2 | 5/2016 | Tsuj |
| 9,356,512 | B2 | 5/2016 | Chowdhury et al. |
| 9,356,760 | B2 | 5/2016 | Larsson et al. |
| 9,391,567 | B2 | 7/2016 | Kacman |
| 9,407,476 | B2 | 8/2016 | Lim et al. |
| 9,496,828 | B2 | 11/2016 | Ye |
| 9,560,595 | B2 | 1/2017 | Dakshinamurthy et al. |
| 9,590,563 | B2 | 3/2017 | Wimpenny |
| 9,614,477 | B1 | 4/2017 | Rozenblit et al. |
| 9,634,560 | B2 | 4/2017 | Ek |
| 9,755,677 | B2 | 9/2017 | Talty et al. |
| 9,991,913 | B1 | 6/2018 | Dinur et al. |
| 10,097,145 | B1 | 10/2018 | Khlat et al. |
| 10,103,926 | B1 | 10/2018 | Khlat |
| 10,142,074 | B2 | 11/2018 | Wang et al. |
| 10,243,524 | B2 | 3/2019 | Orr |
| 10,326,408 | B2 | 6/2019 | Khlat et al. |
| 10,476,437 | B2 | 11/2019 | Nag et al. |
| 10,778,094 | B2 | 9/2020 | de Cremoux |
| 10,862,428 | B2 | 12/2020 | Henzler et al. |
| 10,998,859 | B2 | 5/2021 | Khlat |
| 11,018,627 | B2 | 5/2021 | Khlat |
| 11,018,638 | B2 | 5/2021 | Khlat et al. |
| 11,088,660 | B2 | 8/2021 | Lin et al. |
| 11,223,323 | B2 | 1/2022 | Drogi et al. |
| 11,223,325 | B2 | 1/2022 | Drogi et al. |
| 11,349,513 | B2 | 5/2022 | Khlat et al. |
| 11,539,330 | B2 | 12/2022 | Khlat |
| 11,569,783 | B2 | 1/2023 | Nomiyama et al. |
| 11,588,449 | B2 | 2/2023 | Khlat et al. |
| 11,665,654 | B2 | 5/2023 | Park et al. |
| 11,716,057 | B2 | 8/2023 | Khlat |
| 11,728,774 | B2 | 8/2023 | Khlat |
| 11,757,414 | B2 | 9/2023 | Drogi et al. |
| 11,894,767 | B2 | 2/2024 | Khlat et al. |
| 11,909,385 | B2 | 2/2024 | Khlat |
| 11,973,469 | B2 | 4/2024 | Retz et al. |
| 11,984,853 | B2 | 5/2024 | Khlat |
| 11,984,854 | B2 | 5/2024 | Khlat et al. |
| 12,063,018 | B2 | 8/2024 | Khlat |
| 2003/0099230 | A1 | 5/2003 | Wenk |
| 2004/0179382 | A1 | 9/2004 | Thaker et al. |
| 2011/0109393 | A1 | 5/2011 | Adamski et al. |
| 2012/0068767 | A1 | 3/2012 | Henshaw et al. |
| 2013/0141063 | A1 | 6/2013 | Kay et al. |
| 2013/0141068 | A1 | 6/2013 | Kay et al. |
| 2014/0055197 | A1 | 2/2014 | Khlat et al. |
| 2014/0097895 | A1 | 4/2014 | Khlat et al. |
| 2014/0232458 | A1 | 8/2014 | Arno et al. |
| 2014/0312710 | A1 | 10/2014 | Li |
| 2014/0315504 | A1 | 10/2014 | Sakai et al. |
| 2014/0361837 | A1 | 12/2014 | Strange et al. |
| 2015/0270806 | A1 | 9/2015 | Wagh et al. |
| 2016/0094192 | A1 | 3/2016 | Khesbak et al. |
| 2016/0241208 | A1 | 8/2016 | Lehtola |
| 2016/0294587 | A1 | 10/2016 | Jiang et al. |
| 2017/0331433 | A1 | 11/2017 | Khlat |
| 2017/0373644 | A1 | 12/2017 | Gatard et al. |
| 2018/0092047 | A1 | 3/2018 | Merlin |
| 2018/0234011 | A1 | 8/2018 | Muramatsu et al. |
| 2018/0257496 | A1 | 9/2018 | Andoh et al. |
| 2018/0278213 | A1 | 9/2018 | Henzler et al. |
| 2018/0351454 | A1 | 12/2018 | Khesbak et al. |
| 2019/0068234 | A1 | 2/2019 | Khlat et al. |
| 2019/0109566 | A1 | 4/2019 | Folkmann et al. |
| 2019/0181813 | A1 | 6/2019 | Maxim et al. |
| 2019/0222175 | A1 | 7/2019 | Khlat et al. |
| 2019/0288645 | A1 | 9/2019 | Nag et al. |
| 2019/0334750 | A1 | 10/2019 | Nomiyama et al. |
| 2019/0356285 | A1 | 11/2019 | Khlat et al. |
| 2020/0076297 | A1 | 3/2020 | Nag et al. |
| 2020/0127612 | A1 | 4/2020 | Khlat et al. |
| 2020/0136575 | A1 | 4/2020 | Khlat et al. |
| 2020/0204422 | A1 | 6/2020 | Khlat |
| 2020/0212796 | A1 | 7/2020 | Murphy et al. |
| 2020/0228063 | A1 | 7/2020 | Khlat |
| 2020/0266766 | A1 | 8/2020 | Khlat et al. |
| 2020/0295708 | A1 | 9/2020 | Khlat |
| 2020/0321917 | A1 | 10/2020 | Nomiyama et al. |
| 2020/0336105 | A1 | 10/2020 | Khlat |
| 2020/0336111 | A1 | 10/2020 | Khlat |
| 2020/0382061 | A1 | 12/2020 | Khlat |
| 2020/0382062 | A1 | 12/2020 | Khlat |
| 2020/0389132 | A1 | 12/2020 | Khlat et al. |
| 2021/0036604 | A1 | 2/2021 | Khlat et al. |
| 2021/0099137 | A1 | 4/2021 | Drogi et al. |
| 2021/0126599 | A1 | 4/2021 | Khlat et al. |
| 2021/0175798 | A1 | 6/2021 | Liang |
| 2021/0184708 | A1 | 6/2021 | Khlat |
| 2021/0194517 | A1 | 6/2021 | Mirea et al. |
| 2021/0218374 | A1 | 7/2021 | Poulin |
| 2021/0226585 | A1 | 7/2021 | Khlat |
| 2021/0257971 | A1 | 8/2021 | Kim et al. |
| 2021/0265953 | A1 | 8/2021 | Khlat |
| 2021/0288615 | A1 | 9/2021 | Khlat |
| 2021/0389789 | A1 | 12/2021 | Khlat et al. |
| 2021/0391833 | A1 | 12/2021 | Khlat et al. |
| 2022/0021302 | A1 | 1/2022 | Khlat et al. |
| 2022/0029614 | A1 | 1/2022 | Khlat |
| 2022/0037982 | A1 | 2/2022 | Khlat et al. |
| 2022/0052655 | A1 | 2/2022 | Khalt |
| 2022/0057820 | A1 | 2/2022 | Khlat et al. |
| 2022/0066487 | A1 | 3/2022 | Khlat |
| 2022/0069788 | A1 | 3/2022 | King et al. |
| 2022/0123744 | A1 | 4/2022 | Khlat |
| 2022/0200447 | A1 | 6/2022 | Khlat |
| 2022/0224364 | A1 | 7/2022 | Kim et al. |
| 2022/0271714 | A1 | 8/2022 | Khlat |
| 2022/0294486 | A1 | 9/2022 | Cao et al. |
| 2022/0407465 | A1 | 12/2022 | Khlat |
| 2023/0081095 | A1 | 3/2023 | Khlat |
| 2023/0085587 | A1 | 3/2023 | Shute |
| 2023/0119987 | A1 | 4/2023 | Khlat |
| 2023/0124652 | A1 | 4/2023 | Khlat et al. |
| 2023/0124941 | A1 | 4/2023 | Khlat |
| 2024/0172131 | A1 | 5/2024 | Ballantyne et al. |
| 2024/0223129 | A1 | 7/2024 | Retz et al. |

FOREIGN PATENT DOCUMENTS

| | | |
|---|---|---|
| WO | 2018187245 A1 | 10/2018 |
| WO | 2021016350 A1 | 1/2021 |

OTHER PUBLICATIONS

Final Office Action for U.S. Appl. No. 17/408,899, mailed Dec. 27, 2022, 13 pages.

U.S. Appl. No. 17/942,472, filed Sep. 12, 2022.

U.S. Appl. No. 17/946,224, filed Sep. 16, 2022.

U.S. Appl. No. 17/946,470, filed Sep. 16, 2022.

U.S. Appl. No. 17/947,567, filed Sep. 19, 2022.

International Preliminary Report on Patentability for International Patent Application No. PCT/US2021/061721, mailed Apr. 4, 2023, 21 pages.

Notice of Allowance for U.S. Appl. No. 17/942,472, mailed Oct. 18, 2023, 10 pages.

Corrected Notice of Allowability for U.S. Appl. No. 17/942,472, mailed Nov. 17, 2023, 5 pages.

Notice of Allowance for U.S. Appl. No. 17/316,828, mailed Sep. 13, 2023, 8 pages.

Final Office Action for U.S. Appl. No. 17/942,472, mailed Jul. 19, 2023, 15 pages.

Advisory Action Action for U.S. Appl. No. 17/942,472, mailed Sep. 15, 2023, 3 pages.

Non-Final Office Action for U.S. Appl. No. 18/203, 197, mailed Sep. 16, 2024, 6 pages.

Notice of Allowance for U.S. Appl. No. 17/947,567, mailed Oct. 23, 2024, 11 pages.

Non-Final Office Action for U.S. Appl. No. 17/946,470, mailed Nov. 20, 2024, 31 pages.

(56) References Cited

OTHER PUBLICATIONS

Non-Final Office Action for U.S. Appl. No. 17/217,654, mailed Jul. 1, 2022, 9 pages.
Non-Final Office Action for U.S. Appl. No. 17/218,904, mailed May 25, 2022, 14 pages.
Notice of Allowance for U.S. Appl. No. 17/315,652, mailed Jun. 20, 2022, 8 pages.
Mellon, L., "Data Transmission—Parallel vs Serial," Jul. 10, 2017, https://www.quantil.com/content-delivery-insights/content-acceleration/data-transmission/, 4 pages.
International Search Report and Written Opinion for International Patent Application No. PCT/US2021/044596, mailed Apr. 21, 2022, 13 pages.
Written Opinion for International Patent Application No. PCT/US2021/044596, mailed Jun. 10, 2022, 6 pages.
International Preliminary Report on Patentability for International Patent Application No. PCT/US2021/044596, mailed Sep. 1, 2022, 19 pages.
Notice of Allowance for U.S. Appl. No. 17/182,539, mailed Sep. 14, 2022, 7 pages.
Notice of Allowance for U.S. Appl. No. 17/217,654, mailed Oct. 12, 2022, 8 pages.
Non-Final Office Action for U.S. Appl. No. 17/237,244, mailed Sep. 20, 2021, 14 pages.
Notice of Allowance for U.S. Appl. No. 17/237,244, mailed Jan. 27, 2022, 8 pages.
Notice of Allowance for U.S. Appl. No. 17/218,904, mailed Aug. 26, 2022, 9 pages.
Non-Final Office Action for U.S. Appl. No. 17/325,482, mailed Sep. 30, 2021, 10 pages.
Non-Final Office Action for U.S. Appl. No. 17/325,482, mailed Mar. 15, 2022, 10 pages.
Final Office Action for U.S. Appl. No. 17/325,482, mailed Aug. 16, 2022, 12 pages.
Advisory Action for U.S. Appl. No. 17/325,482, mailed Oct. 14, 2022, 3 pages.
Non-Final Office Action for U.S. Appl. No. 17/315,652, mailed Sep. 2, 2021, 7 pages.
Non-Final Office Action for U.S. Appl. No. 17/315,652, mailed Feb. 14, 2022, 12 pages.
Non-Final Office Action for U.S. Appl. No. 17/408,899, mailed Aug. 29, 2022, 13 pages.
International Search Report and Written Opinion for International Patent Application No. PCT/US2021/061721, mailed Mar. 14, 2022, 13 pages.
Written Opinion for International Patent Application No. PCT/US2021/061721, mailed Sep. 9, 2022, 7 pages.
Paek, J.S. et al., "15.2 A 90ns/V Fast-Transition Symbol-Power-Tracking Buck Converter for 5G mm-Wave Phased-Array Transceiver," 2019 IEEE International Solid-State Circuits Conference, Feb. 2019, San Francisco, CA, USA, IEEE, 3 pages.
Notice of Allowance for U.S. Appl. No. 17/217,594, mailed Apr. 3, 2023, 7 pages.
Notice of Allowance for U.S. Appl. No. 17/408,899, mailed Feb. 24, 2023, 9 pages.
Non-Final Office Action for U.S. Appl. No. 17/942,472, mailed Feb. 16, 2023, 13 pages.
Extended European Search Report for European Patent Application No. 22195683.2, mailed Feb. 10, 2023, 12 pages.
Written Opinion for International Patent Application No. PCT/US2021/061721, mailed Mar. 1, 2023, 7 pages.
Extended European Search Report for European Patent Application No. 22200302.2, mailed Mar. 1, 2023, 14 pages.
Extended European Search Report for European Patent Application No. 22200322.0, mailed Mar. 1, 2023, 13 pages.
Extended European Search Report for European Patent Application No. 22200300.6, mailed Feb. 24, 2023, 10 pages.
Extended European Search Report for European Patent Application No. 22200111.7, mailed Feb. 20, 2023, 9 pages.

MULTI-VOLTAGE GENERATION CIRCUIT

RELATED APPLICATIONS

This application claims the benefit of provisional patent application Ser. No. 63/255,649, filed Oct. 14, 2021, the disclosure of which is hereby incorporated herein by reference in its entirety.

FIELD OF THE DISCLOSURE

The present disclosure is related to a power management circuit operable to maintain multiple voltages simultaneously.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by such advanced wireless communication technologies as fifth-generation new-radio (5G-NR). To achieve higher data rates, a mobile communication device may employ a power amplifier(s) to amplify a radio frequency (RF) signal(s) (e.g., maintaining sufficient energy per bit) before transmission. Given that the power amplifier(s) requires a supply voltage(s) for operation, a power management integrated circuit (PMIC) is thus required to generate and provide the supply voltage(s) to the power amplifier(s).

Given that the PMIC often needs to concurrently generate multiple supply voltages for multiple power amplifiers, the PMIC typically includes multiple direct-current to direct-current (DC-DC) converters for modulating the multiple supply voltages. Having the multiple DC-DC converters will inevitably increase footprint of the PMIC, thus making it difficult to fit the PMIC into an increasing miniaturized electronic device(s) such as smartphone and smart gadgets. Hence, it is desirable to reduce the number of DC-DC converters in the PMIC to help reduce the footprint of the PMIC.

SUMMARY

Embodiments of the disclosure relate to a multi-voltage generation circuit. More specifically, the multi-voltage generation circuit includes multiple voltage modulation circuits that are configured to generate and maintain multiple modulated voltages. In a non-limiting example, the multiple modulated voltages can be used for amplifying multiple radio frequency (RF) signals concurrently. Contrary to using multiple direct-current (DC) to DC (DC-DC) converters for generating the multiple modulated voltages, the voltage modulation circuits are configured to share a single current modulation circuit based on time-division. By sharing a single current modulation circuit among the multiple voltage modulation circuits, it is possible to concurrently support multiple load circuits (e.g., power amplifier circuits) with significantly reduced footprint.

In one aspect, a multi-voltage generation circuit is provided. The multi-voltage generation circuit includes multiple voltage modulation circuits. Each of the multiple voltage modulation circuits includes a respective one of multiple voltage amplifiers configured to generate a respective one of multiple modulated initial voltages based on a respective one of multiple modulated target voltages. Each of the multiple voltage modulation circuits also includes a respective one of multiple offset capacitors configured to raise the respective one of the multiple modulated initial voltages by a respective one of multiple offset voltages to thereby generate a respective one of multiple modulated voltages. The multi-voltage generation circuit also includes a control circuit. The control circuit is configured to determine multiple charge intervals and multiple discharge intervals in each of one or more operation periods. The control circuit is also configured to cause each of the multiple offset capacitors to be charged to the respective one of the multiple offset voltages during a respective one of the multiple charge intervals. The control circuit is also configured to cause each of the multiple offset capacitors to be discharged to maintain the respective one of the multiple modulated voltages during a respective one of the multiple discharge intervals.

In another aspect, a method for generating and maintaining multiple voltages is provided. The method includes determining multiple charge intervals and multiple discharge intervals in each of one or more operation periods. The method also includes generating a respective one of multiple modulated initial voltages during a respective one of the multiple charge intervals. The method also includes charging a respective one of multiple offset capacitors during the respective one of the multiple charge intervals to a respective one of multiple offset voltages to thereby raise the respective one of the multiple modulated initial voltages to a respective one of multiple modulated voltages. The method also includes discharging the respective one of the multiple offset capacitors during a respective one of the multiple discharge intervals to maintain the respective one of the multiple modulated voltages.

In another aspect, a multi-voltage power management circuit is provided. The multi-voltage power management circuit includes multiple power amplifier circuits. The multiple power amplifier circuits are configured to concurrently amplify multiple radio frequency (RF) signals based on multiple modulated voltages, respectively. The multi-voltage power management circuit also includes a multi-voltage generation circuit. The multi-voltage generation circuit includes multiple voltage modulation circuits. Each of the multiple voltage modulation circuits includes a respective one of multiple voltage amplifiers configured to generate a respective one of multiple modulated initial voltages based on a respective one of multiple modulated target voltages. Each of the multiple voltage modulation circuits also includes a respective one of multiple offset capacitors configured to raise the respective one of the multiple modulated initial voltages by a respective one of multiple offset voltages to thereby generate a respective one of the multiple modulated voltages. The multi-voltage generation circuit also includes a control circuit. The control circuit is configured to determine multiple charge intervals and multiple discharge intervals in each of one or more operation periods. The control circuit is also configured to cause each of the multiple offset capacitors to be charged to the respective one of the multiple offset voltages during a respective one of the multiple charge intervals. The control circuit is also configured to cause each of the multiple offset capacitors to be discharged to maintain the respective one of the multiple modulated voltages during a respective one of the multiple discharge intervals.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1:
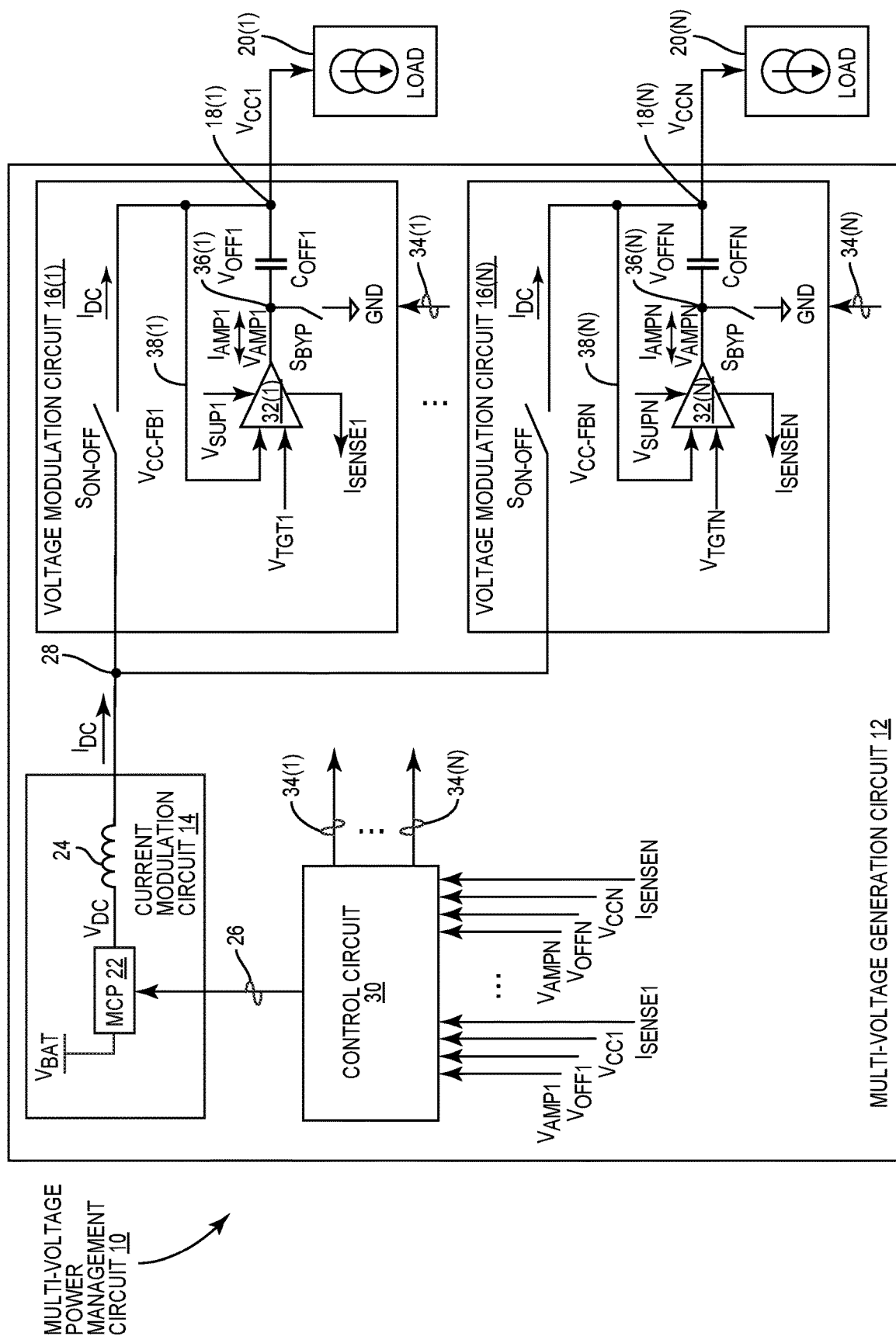
FIG. 1 is a schematic diagram of an exemplary multi-voltage power management circuit wherein a multi-voltage generation circuit is configured according to embodiments of the present disclosure to concurrently generate and maintain multiple modulated voltages by sharing a current modulation circuit.
Figure 3:
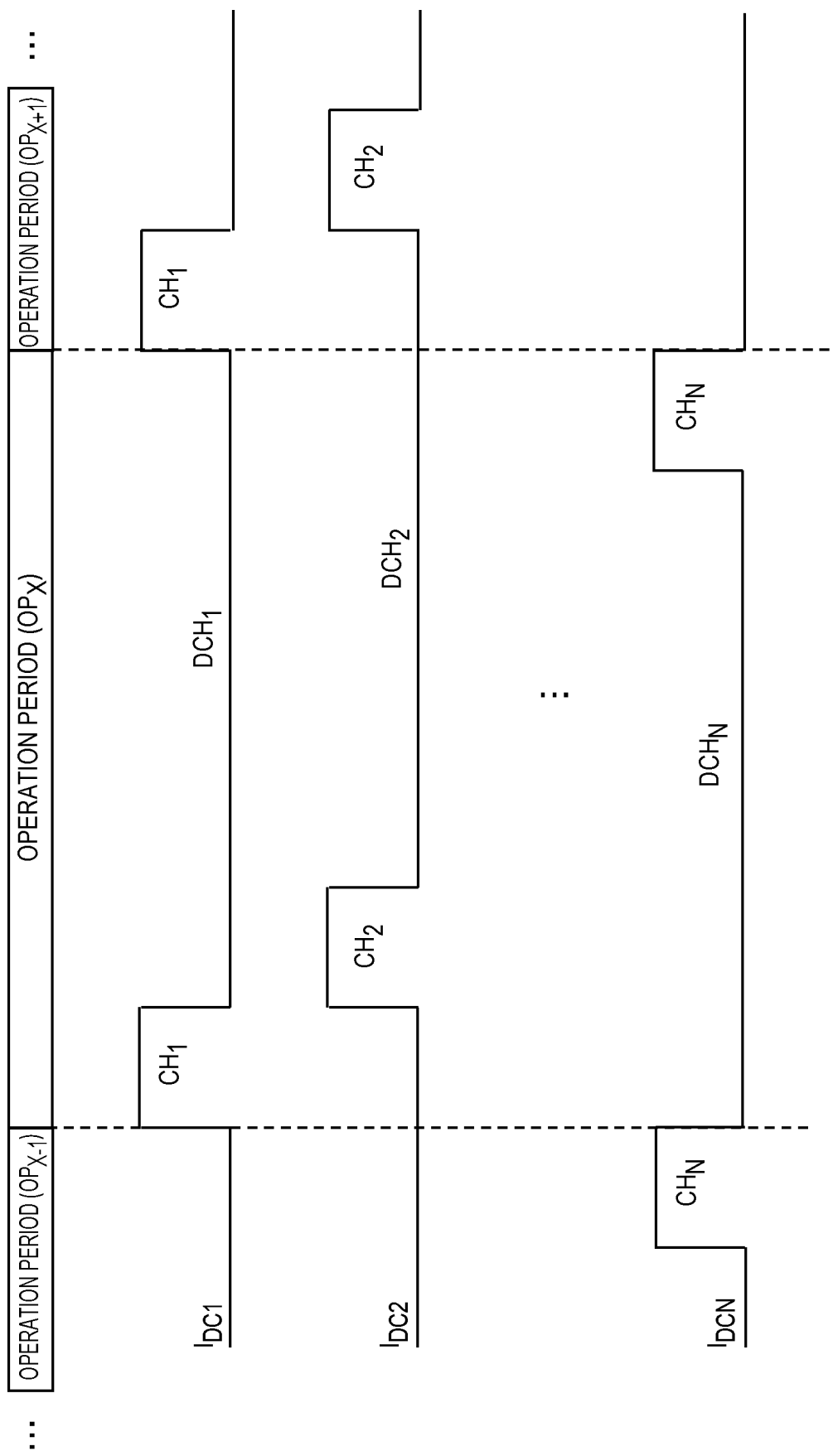
Figure 4:
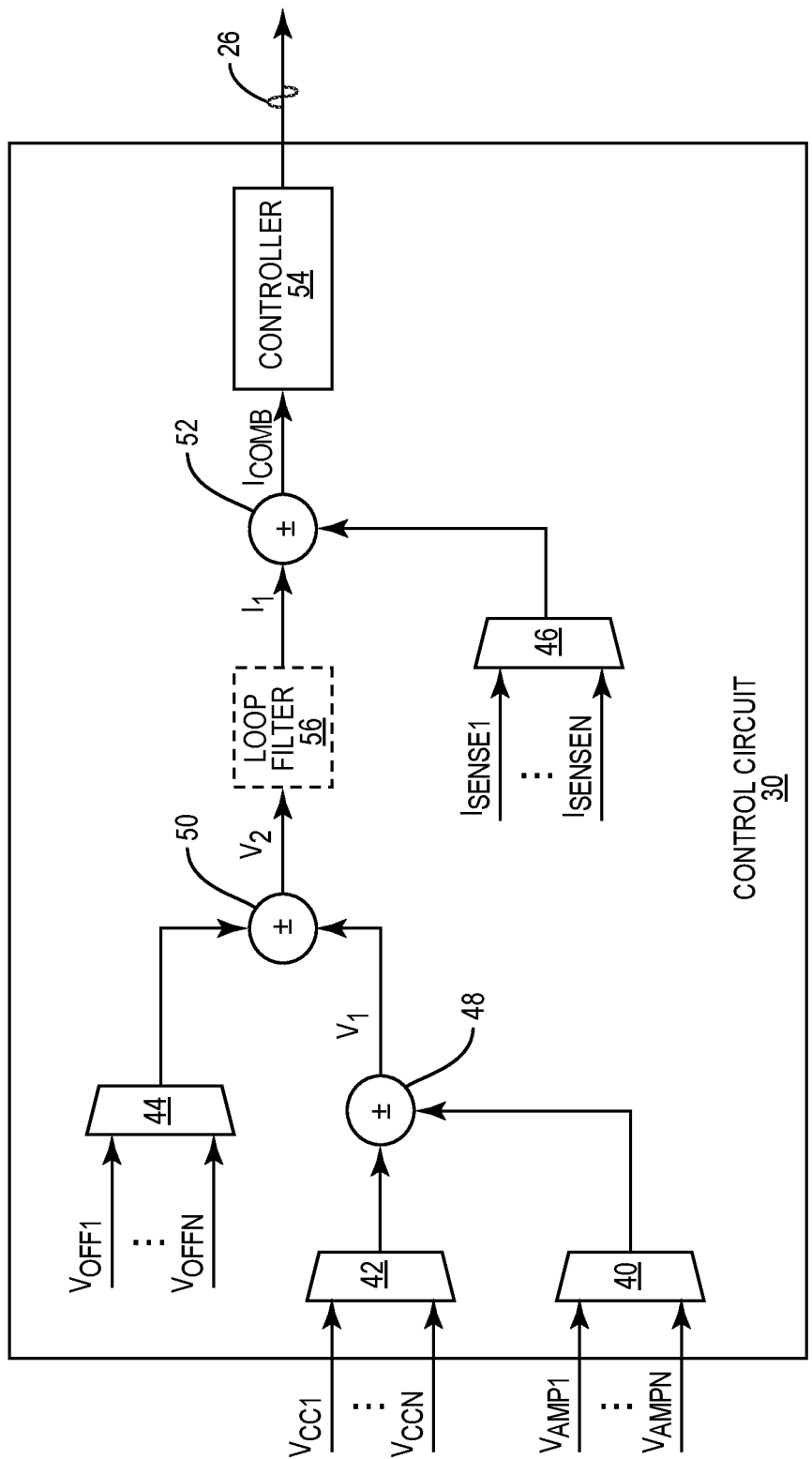
Figure 5:

FIG. 3 provides an exemplary illustration of a time-division scheme that can be employed by the multi-voltage generation circuit in FIG. 1 for concurrently generating and maintaining the multiple modulated voltages;

FIG. 4 is a schematic diagram of an exemplary control circuit that can be provided in the multi-voltage generation circuit in FIG. 1 for generating and maintaining the multiple modulated voltages concurrently; and FIG. 5 is a flowchart of an exemplary process that can be employed by the multi-voltage generation circuit in FIG. 1 for concurrently generating and maintaining the multiple modulated voltages.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to a multi-voltage generation circuit. More specifically, the multi-voltage generation circuit includes multiple voltage modulation circuits that are configured to generate and maintain multiple modulated voltages. In a non-limiting example, the multiple modulated voltage can be used for amplifying multiple radio frequency (RF) signals concurrently. Contrary to using multiple direct-current (DC) to DC (DC-DC) converters for generating the multiple modulated voltages, the voltage modulation circuits are configured to share a single current modulation circuit based on time-division. By sharing a single current modulation circuit among the multiple voltage modulation circuits, it is possible to concurrently support multiple load circuits (e.g., power amplifier circuits) with significantly reduced footprint.

In this regard, FIG. 1 is a schematic diagram of an exemplary multi-voltage power management circuit 10 wherein a multi-voltage generation circuit 12 is configured according to embodiments of the present disclosure to concurrently generate and maintain multiple modulated voltages $V_{CC1}$-$V_{CCN}$ by sharing a current modulation circuit 14. Herein, the multi-voltage generation circuit 12 includes multiple voltage modulation circuits 16(1)-16(N) each configured to share the current modulation circuit 14 based on time-division to thereby generate and maintain a respective one of the modulated voltages $V_{CC1}$-$V_{CCN}$. The voltage modulation circuits 16(1)-16(N) are configured to output the modulated voltages $V_{CC1}$-$V_{CCN}$ via multiple voltage outputs 18(1)-18(N), respectively.

In an embodiment, the voltage outputs 18(1)-18(N) are coupled to multiple load circuits 20(1)-20(N), respectively. In this regard, the voltage modulation circuits 16(1)-16(N) are configured to concurrently provide and maintain the modulated voltages $V_{CC1}$-$V_{CCN}$ for the load circuits 20(1)-20(N). In a non-limiting example, the load circuits 20(1)-20(N) can be power amplifier circuits each configured to amplify a respective one of multiple RF signals (not shown) based on a respective one of the modulated voltages $V_{CC1}$-$V_{CCN}$. Understandably, the load circuits 20(1)-20(N) can also be any other active circuits that operate based on a voltage. Further, the load circuits 20(1)-20(N) may also include a mixture of power amplifier circuits and other types of active circuits. By sharing the current modulation circuit 14 among the voltage modulation circuits 16(1)-16(N), the multi-voltage power management circuit 10 can concurrently support the load circuits 20(1)-20(N) with significantly reduced footprint.

According to an embodiment of the present disclosure, the current modulation circuit 14 includes a multi-level charge pump (MCP) 22 and a power inductor 24. The MCP 22 is configured to operate based on a duty cycle 26 to generate a low-frequency voltage $V_{DC}$ (e.g., a DC voltage) as a function of a battery voltage $V_{BAT}$. In a non-limiting example, the MCP 22 can be a DC-DC buck-boost converter that can operate in a buck mode and/or a boost mode. Herein, the MCP 22 is configured to generate the low-frequency voltage $V_{DC}$ at $0 \times V_{BAT}$ or $1 \times V_{BAT}$ when operating in the buck mode, or at $2 \times V_{BAT}$ when operating in the boost mode. Understandably, the MCP 22 can toggle between $0 \times V_{BAT}$, $1 \times V_{BA}$, and/or $2 \times V_{BAT}$ based on the duty cycle 26 to thereby generate the low-frequency voltage $V_{DC}$ at any desired voltage level. In other words, it is possible to adjust the low-frequency voltage $V_{DC}$ by simply adjusting the duty cycle 26.

The power inductor 24 is coupled between the MCP 22 and a common node 28. Herein, the power inductor 24 is configured to induce a low-frequency current IDC (e.g., a DC current) based on the low-frequency voltage $V_{DC}$. Given that the low-frequency voltage $V_{DC}$ can be adjusted based on the duty cycle 26, the low-frequency current IDC can likewise be adjusted based on the duty cycle 26.

In an embodiment, the multi-voltage generation circuit 12 further includes a control circuit 30, which can be a field-programmable gate array (FPGA) or an application-specific integrated circuit (ASIC), as an example. As further discussed in FIG. 4, the control circuit 30 can be configured to adjust the duty cycle 26 based on a variety of feedback provided by the voltage modulation circuits 16(1)-16(N). In addition, the control circuit 30 is further configured to determine a time-division schedule whereby the voltage modulation circuits 16(1)-16(N) can share the current modulation circuit 14.

In an embodiment, each of the voltage modulation circuits 16(1)-16(N) includes a respective one of multiple voltage amplifiers 32(1)-32(N), a respective one of multiple offset capacitors $C_{OFF1}$-$C_{OFFN}$, a respective bypass switch $S_{BYP}$, and a respective on-off switch $S_{ON\text{-}OFF}$. In a non-limiting example, the control circuit 30 can control (e.g., toggle) the bypass switch $S_{BYP}$ and the on-off switch $S_{ON\text{-}OFF}$ in each of the voltage modulation circuits 16(1)-16(N) via a respective one of multiple control signals 34(1)-34(N).

Each of the voltage amplifiers 32(1)-32(N) is configured to generate a respective one of multiple modulated initial voltages $V_{AMP1}$-$V_{AMPN}$ at a respective one of multiple outputs 36(1)-36(N) based on a respective one of multiple modulated target voltages $V_{TGT1}$-$V_{TGTN}$ and a respective one of multiple supply voltages $V_{SUP1}$-$V_{SUPN}$. For example, the voltage amplifier 32(1) generates the modulated initial voltage $V_{AMP1}$ at the output 36(1) of the voltage amplifier 32(1) based on the modulated target voltage $V_{TGT1}$ and the supply voltage $V_{SUP1}$, and the voltage amplifier 32(N) generates the modulated initial voltage $V_{AMPN}$ at the output 36(N) of the voltage amplifier 32(N) based on the modulated target voltage $V_{TGTN}$ and the supply voltage $V_{SUPN}$.

In an embodiment, each of the voltage amplifiers 32(1)-32(N) may be configured to source or sink a respective one of multiple high-frequency current $I_{AMP1}$-$I_{AMPN}$ (e.g., alternating currents) to help maintain a respective one of the modulated voltages $V_{CC1}$-$V_{CCN}$ at a desired level. In this regard, each of the voltage amplifiers 32(1)-32(N) may generate a respective one of multiple sense currents $I_{SENSE1}$-$I_{SENSEN}$ to indicate an amount of the respective one of the high-frequency current $I_{AMP1}$-$I_{AMPN}$ that is sourced or sunk by the respective one of the voltage amplifiers 32(1)-32(N).

Each of the offset capacitors $C_{OFF1}$-$C_{OFFN}$ is coupled between a respective one of the outputs 36(1)-36(N) and a respective one of the voltage outputs 18(1)-18(N). For example, the offset capacitor $C_{OFF1}$ is coupled between the output 36(1) of the voltage amplifier 32(1) and the voltage output 18(1) of the voltage modulation circuit 16(1), and the offset capacitor $C_{OFFN}$ is coupled between the output 36(N) of the voltage amplifier 32(N) and the voltage output 18(N) of the voltage modulation circuit 16(N). Each of the offset capacitors $C_{OFF1}$-$C_{OFFN}$ is configured to raise a respective one of the modulated voltages $V_{AMP1}$-$V_{AMPN}$ by a respective one of multiple offset voltages $V_{OFF1}$-$V_{OFFN}$ to thereby generate a respective one of the modulated voltages $V_{CC1}$-$V_{CCN}$ at a respective one of the voltage outputs 18(1)-18(N). For example, the offset capacitor $C_{OFF1}$ is configured to raise the modulated initial voltage $V_{AMP1}$ by the offset voltage $V_{OFF1}$ to thereby generate the modulated voltage $V_{CC1}$ ($V_{CC1}=V_{AMP1}+V_{OFF1}$) at the voltage output 18(1), and the offset capacitor $C_{OFFN}$ is configured to raise the modulated initial voltage $V_{AMPN}$ by the offset voltage $V_{OFFN}$ to thereby generate the modulated voltage $V_{CCN}$ ($V_{CCN}=V_{AMPN}+V_{OFFN}$) at the voltage output 18(N).

In one embodiment, the offset capacitors $C_{OFF1}$-$C_{OFFN}$ can be configured to have an identical capacitance. In an alternative embodiment, the offset capacitors $C_{OFF1}$-$C_{OFFN}$ can also be configured to have different capacitances. Further, the offset capacitors $C_{OFF1}$-$C_{OFFN}$ can also be a same type or different types of capacitors.

The bypass switch $S_{BYP}$ in each of the voltage modulation circuits 16(1)-16(N) is coupled between a respective one of the outputs 36(1)-36(N) and a ground (GND). For example, the bypass switch $S_{BYP}$ in the voltage modulation circuit 16(1) is coupled between the output 36(1) of the voltage amplifier 32(1) and the GND, and the bypass switch $S_{BYP}$ in the voltage modulation circuit 16(N) is coupled between the output 36(N) of the voltage amplifier 32(N) and the GND.

The on-off switch $S_{ON\text{-}OFF}$ in each of the voltage modulation circuits 16(1)-16(N) is coupled between the common node 28 and a respective one of the voltage outputs 18(1)-18(N). For example, the on-off switch $S_{ON\text{-}OFF}$ in the voltage modulation circuit 16(1) is coupled between the common node 28 and the voltage output 18(1) of the voltage modulation circuit 16(1), and the on-off switch $S_{ON\text{-}OFF}$ in the voltage modulation circuit 16(N) is coupled between the common node 28 and the voltage output 18(N) of the voltage modulation circuit 16(N).

Each of the voltage modulation circuits 16(1)-16(N) further includes a respective one of multiple voltage feedback paths 38(1)-38(N). Each of the voltage feedback paths 38(1)-38(N) is configured to provide a respective one of multiple modulated voltage feedbacks $V_{CC\text{-}FB1}$-$V_{CC\text{-}FBN}$ from a respective one of the voltage outputs 18(1)-18(N) to a respective input of the voltage amplifiers 32(1)-32(N). In this regard, each of the voltage modulation circuits 16(1)-16(N) is a closed-loop voltage modulation circuit.

Each of the voltage modulation circuits 16(1)-16(N) can be configured to generate and maintain a respective one of the modulated voltages $V_{CC1}$-$V_{CCN}$ based on operations described below. Herein, operations of the voltage modulation circuit 16(1) are discussed as a non-limiting example. Understandably, the operation principles described with reference to the voltage modulation circuit 16(1) are applicable to any of the voltage modulation circuits 16(1)-16(N).

Figure 2:
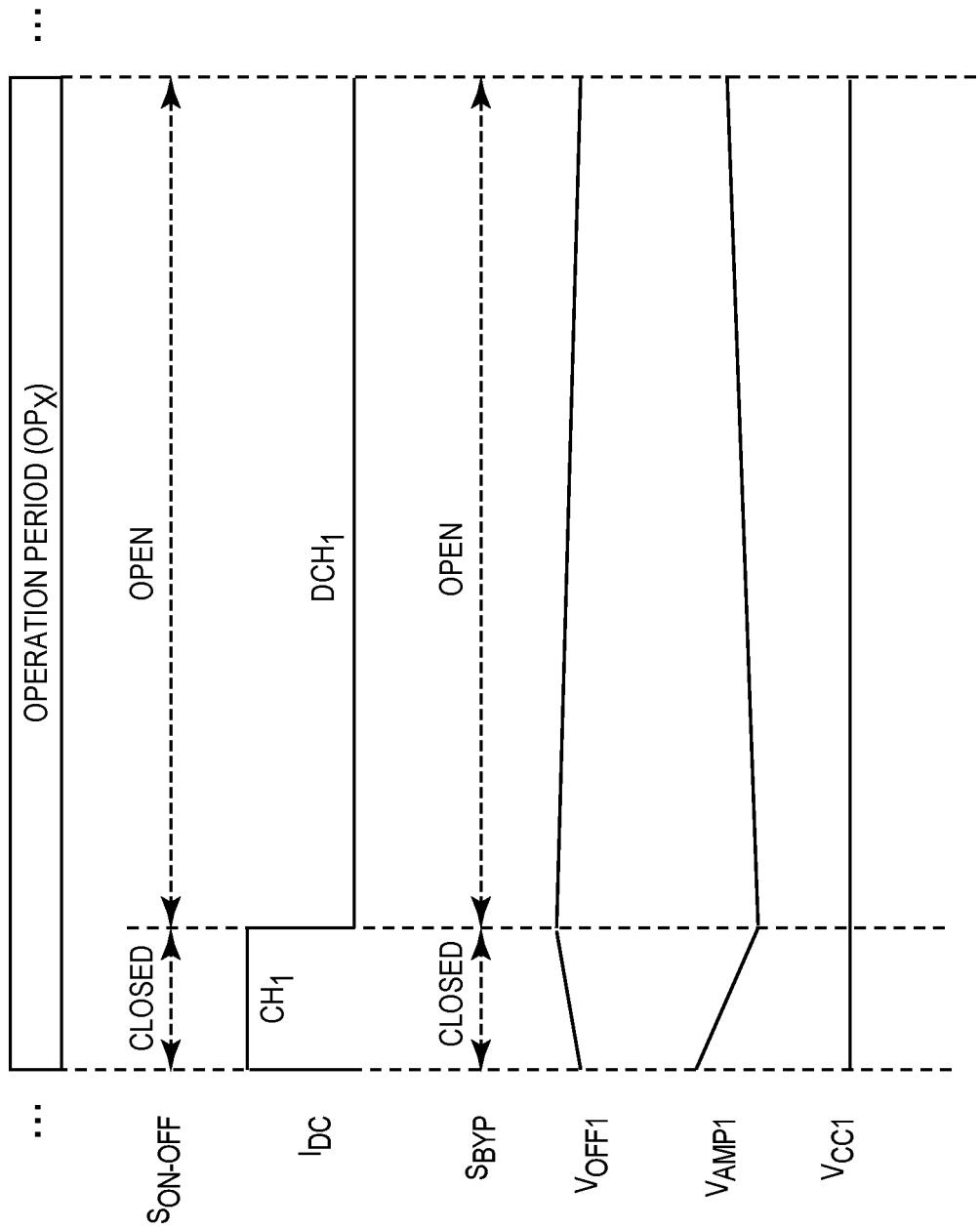
FIG. 2 illustrates an exemplary operation of a voltage modulation circuit for generating and maintaining any one of the multiple modulated voltages during an operation period(s)

In essence, the voltage modulation circuit 16(1) can be configured to generate and maintain the modulated voltage $V_{CC1}$ by toggling repeatedly between a charge interval and a discharge interval. FIG. 2 illustrates an exemplary operation of the voltage modulation circuit 16(1) for generating and maintain the modulated voltage $V_{CC1}$ by toggling between a charge interval $CH_1$ and a discharge interval $DCH_1$ during an operation period $OP_X$. Common elements between FIGS. 1 and 2 are shown therein with common element numbers and will not be re-described herein.

During the charge interval $CH_1$, the control circuit 30 closes the on-off switch $S_{ON\text{-}OFF}$ and the bypass switch $S_{BYP}$ such that the low-frequency current $I_{DC}$ can flow from the common node 28 through the offset capacitor $C_{OFF1}$ and to the GND to thereby charge the offset capacitor $C_{OFF1}$ to the offset voltage $V_{OFF1}$. While the offset capacitor $C_{OFF}$ is being charged, the control circuit 30 activates the voltage amplifier 32(1) to generate the modulated initial voltage $V_{AMP1}$ to help maintain the modulated voltage $V_{CC1}$ at a desired level.

Once the offset capacitor $C_{OFF1}$ is charged up to the offset voltage $V_{OFF1}$, the voltage modulation circuit 16(1) will enter the discharge interval $DCH_1$. During the discharge interval $DCH_1$, the control circuit 30 opens the on-off switch $S_{ON\text{-}OFF}$ and the bypass switch $S_{BYP}$ concurrently. In this regard, the low-frequency current $I_{DC}$ is blocked from the common node and the offset capacitor $C_{OFF1}$ is gradually discharged to maintain the modulated voltage $V_{CC1}$ at the desired level.

As shown in FIG. 2, during the charge interval $CH_1$, the voltage amplifier 32(1) may gradually reduce the modulated initial voltage $V_{AMP1}$ as the offset capacitor $C_{OFF1}$ is charged to gradually increase the offset voltage $V_{OFF1}$. In contrast, during the discharge interval $DCH_1$, the offset voltage $V_{OFF1}$ will gradually decrease as the offset capacitor $C_{OFF1}$ is discharged. Accordingly, the voltage amplifier 32(1) may gradually increase the modulated initial voltage $V_{AMP1}$. As such, the voltage modulation circuit 16(1) can maintain the modulated voltage $V_{CC1}$ consistently at the desired level.

In an embodiment, the voltage amplifier 32(1) may source or sink the high-frequency current $I_{AMP1}$ to help charge or discharge a holding capacitor (not shown) in the load circuit 20(1) to thereby help maintain the modulated voltage $V_{CC1}$ at the desired level. In this regard, the voltage amplifier 32(1) will generate the sense current $I_{SENSE1}$ to indicate the high-frequency current $I_{AMP1}$ that is sourced or sunk by the voltage amplifier 32(1).

With reference back to FIG. 1, each of the voltage modulation circuits 16(2)-16(N) can be configured to generate and maintain a respective one of the modulated voltages $V_{CC2}$-$V_{CCN}$ by toggling repeatedly between a respective charge interval and a respective discharge interval as described above in the example of the voltage modulation circuit 16(1). In this regard, the control circuit 30 is configured to determine the respective charge interval and the respective discharge interval for each of the voltage modulation circuits 16(1)-16(N) such that the voltage modulation circuits 16(1)-16(N) can share the current modulation circuit 14 on a time-division basis.

FIG. 3 provides an exemplary illustration of a time-division operation among the voltage modulation circuits 16(1)-16(N) in FIG. 1. Common elements between FIGS. 1 and 3 are shown therein with common element numbers and will not be re-described herein.

Notably, the time-division operation is repeated in each of one or more operation periods $OP_{X-1}$, $OP_X$, $OP_{X+1}$. Notably, the operation periods $OP_{X-1}$, $OP_X$, $OP_{X+1}$ are merely examples for the purpose of illustration. It should be appreciated that the time-division operation can be repeated over any number of operation periods as needed.

Specifically, during the operation period $OP_X$, the control circuit 30 determines multiple charge intervals $CH_1$-$CH_N$ and multiple discharge intervals $DCH_1$-$DCH_N$ for the voltage modulation circuits 16(1)-16(N), respectively. As shown in FIG. 3, the charge intervals $CH_1$-$CH_N$ are so determined not to overlap with one another. In contrast, the discharge intervals $DCH_1$-$DCH_N$ may overlap with one another.

The charge intervals $CH_1$-$CH_N$ can be of equal duration or different durations, depending on whether the offset capacitors $C_{OFF1}$-$C_{OFFN}$ are having an identical capacitance or different capacitances. Specifically, when the offset capacitors $C_{OFF1}$-$C_{OFFN}$ are having the identical capacitance, the charge intervals $CH_1$-$CH_N$ can have an identical duration. In contrast, when the offset capacitors $C_{OFF1}$-$C_{OFFN}$ are having different capacitances, the charge intervals $CH_1$-$CH_N$ can have different durations. Regardless, a total duration of the charge intervals $CH_1$-$CH_N$ shall be less than or equal to the duration of the operation period $OP_X$.

In this regard, each of the voltage modulation circuits 16(1)-16(N) toggles between a respective one of the charge intervals $CH_1$-$CH_N$ and a respective one of the discharge intervals $DCH_1$-$DCH_N$ to generate and maintain a respective one of the modulated voltages $V_{CC1}$-$V_{CCN}$. The voltage modulation circuits 16(1)-16(N) can make the modulated voltages $V_{CC1}$-$V_{CCN}$ concurrently available to enable simultaneous operations of the load circuits 20(1)-20(N), despite operating based on the time-division scheme.

With reference back to FIG. 1, since the modulated voltages $V_{CC1}$-$V_{CCN}$ can be at different voltage levels, the control circuit 30 needs to adjust the duty cycle 26 accordingly for each of the voltage modulation circuits 16(1)-16(N). According to an embodiment of the present disclosure, the control circuit 30 may determine the duty cycle 26 for a respective one of the voltage modulation circuits 16(1)-16(N) based on one or more of: a respective one of the modulated initial voltages $V_{AMP1}$-$V_{AMPN}$, a respective one of the offset voltages $V_{OFF1}$-$V_{OFFN}$, a respective one of the modulated voltages $V_{CC1}$-$V_{CCN}$, and a respective one of the sense currents $I_{SENSE1}$-$I_{SENSEN}$.

FIG. 4 is a schematic diagram providing an exemplary illustration of the control circuit 30 in FIG. 1 configured according to an embodiment of the present disclosure. Common elements between FIGS. 1 and 4 are shown therein with common element numbers and will not be re-described herein.

Herein, the control circuit 30 includes a first multiplexer 40, a second multiplexer 42, a third multiplexer 44, a fourth multiplexer 46, a first combiner 48, a second combiner 50, a third combiner 52, a controller 54, and a loop filter 56.

When determining the duty cycle 26 for a respective one of the voltage modulation circuits 16(1)-16(N), the first multiplexer 40 outputs a respective one of the modulated initial voltages $V_{AMP1}$-$V_{AMPN}$, the second multiplexer 42 outputs a respective one of the modulated voltages $V_{CC1}$-$V_{CCN}$, the third multiplexer 44 outputs a respective one of the offset voltages $V_{OFF1}$-$V_{OFFN}$, and the fourth multiplexer 46 outputs a respective one of the sense currents $I_{SENSE1}$-$I_{SENSEN}$.

The first combiner 48 combines the respective one of the modulated initial voltages $V_{AMP1}$-$V_{AMPN}$ and the respective one of the modulated voltages $V_{CC1}$-$V_{CCN}$ to output a first combined voltage $V_1$. The second combiner 50 combines the first combined voltage $V_1$ with the respective one of the offset voltages $V_{OFF1}$-$V_{OFFN}$ to output a second voltage $V_2$. The loop filter 56 is configured to convert the second voltage $V_2$ into a first current $I_1$, which is combined with the respective one of the sense currents $I_{SENSE1}$-$I_{SENSEN}$ at the third combiner 52 to generate a combined current $I_{COMB}$. The controller 54, which can be a bang-bang controller as an example, can then determine the duty cycle 26 for the respective one of the voltage modulation circuits 16(1)-16(N) based on the combined current $I_{COMB}$.

The multi-voltage generation circuit 12 in FIG. 2 can be configured to generate and maintain the modulated voltages $V_{CC1}$-$V_{CCN}$ based on a process. In this regard, FIG. 5 is a flowchart of an exemplary process 200 that can be employed for generating and maintaining the modulated voltages $V_{CC1}$-$V_{CCN}$.

Herein, the control circuit 30 determines the charge intervals $CH_1$-CHN and the discharge intervals $DCH_1$-$DCH_N$ in each of the operation periods $OP_{X-1}$, $OP_X$, $OP_{X+1}$, and so on (step 202). Each of the voltage amplifiers 32(1)-32(N) generates a respective one of the modulated initial voltages $V_{AMP1}$-$V_{AMPN}$ during a respective one of the charge intervals $CH_1$-$CH_N$ (step 204). Each of the offset capacitors $C_{OFF1}$-$C_{OFFN}$ is charged during the respective one of the charge intervals $CH_1$-$CH_N$ to a respective one of the offset voltages $V_{OFF1}$-$V_{OFFN}$ to thereby raise the respective one of the modulated initial voltages $V_{AMP1}$-$V_{AMPN}$ to a respective one of the modulated voltages $V_{CC1}$-$V_{CCN}$ (step 206). Each of the offset capacitors $C_{OFF1}$-$C_{OFFN}$ is then discharged during a respective one of the discharge intervals $DCH_1$-$DCH_N$ to maintain the respective one of the modulated voltages $V_{CC1}$-$V_{CCN}$ (step 208).

Those skilled in the art will recognize improvements and modifications to the preferred embodiments of the present disclosure. All such improvements and modifications are considered within the scope of the concepts disclosed herein and the claims that follow.

What is claimed is:

1. A multi-voltage generation circuit comprising:
   a plurality of voltage modulation circuits each comprising:
      a respective one of a plurality of voltage amplifiers configured to generate a respective one of a plurality of modulated initial voltages based on a respective one of a plurality of modulated target voltages; and
      a respective one of a plurality of offset capacitors configured to raise the respective one of the plurality of modulated initial voltages by a respective one of a plurality of offset voltages to thereby generate a respective one of a plurality of modulated voltages; and
   a control circuit configured to:
      determine a plurality of charge intervals and a plurality of discharge intervals in each of one or more operation periods; and
      cause each of the plurality of offset capacitors to be:
         charged to the respective one of the plurality of offset voltages during a respective one of the plurality of charge intervals; and
         discharged to maintain the respective one of the plurality of modulated voltages during a respective one of the plurality of discharge intervals.

2. The multi-voltage generation circuit of claim 1, wherein:
   the plurality of charge intervals does not overlap with one another; and
   the plurality of discharge intervals overlaps with one another.

3. The multi-voltage generation circuit of claim 1, wherein:
   the plurality of offset capacitors has an identical capacitance; and
   the plurality of charge intervals has an identical duration.

4. The multi-voltage generation circuit of claim 1, wherein:
   the plurality of offset capacitors has different capacitances; and
   the plurality of charge intervals has different durations.

5. The multi-voltage generation circuit of claim 1, further comprising a current modulation circuit comprising:
   a multi-level charge pump (MCP) configured to operate based on a duty cycle to generate a low-frequency voltage as a function of a battery voltage; and
   a power inductor coupled between the MCP and a common node and configured to induce a low-frequency current based on the low-frequency voltage;
   wherein the control circuit is further configured to determine the duty cycle for each of the plurality of charge intervals to thereby modulate the low-frequency current in each of the plurality of charge intervals.

6. The multi-voltage generation circuit of claim 5, wherein each of the plurality of voltage modulation circuits further comprises:
   a respective voltage output that outputs the respective one of the plurality of modulated voltages, wherein the respective one of the plurality of offset capacitors is coupled between a respective one of the respective one of the plurality of voltage amplifiers and the respective voltage output;
   a respective bypass switch coupled between the respective output of the respective one of the plurality of voltage amplifiers and a ground; and
   a respective on-off switch coupled between the power inductor and the respective voltage output.

7. The multi-voltage generation circuit of claim 6, wherein the control circuit is further configured to, for each of the plurality of voltage modulation circuits:
   close the respective on-off switch during the respective one of the plurality of charge intervals to provide the low-frequency current from the common node to the respective voltage output;
   close the respective bypass switch during the respective one of the plurality of charge intervals such that the low-frequency current can charge the respective one of the plurality of offset capacitors to the respective one of the plurality of offset voltages; and
   cause the respective one of the plurality of voltage amplifiers to source or sink a respective high-frequency current during the respective one of the plurality of charge intervals to thereby maintain the respective one of the plurality of modulated voltages.

8. The multi-voltage generation circuit of claim 7, wherein the control circuit is further configured to, for each of the plurality of voltage modulation circuits:
open the respective on-off switch during the respective one of the plurality of discharge intervals to block the low-frequency current from flowing from the common node to the respective voltage output; and
open the respective bypass switch during the respective one of the plurality of discharge intervals such that the respective one of the plurality of offset capacitors is discharged to maintain the respective one of the plurality of modulated voltages.

9. The multi-voltage generation circuit of claim 7, wherein each of the plurality of voltage amplifiers is further configured to generate a respective one of a plurality of sense currents indicating a respective amount of the high-frequency current that is sourced/sunk by the respective one of the plurality of voltage amplifiers during the respective one of the plurality of charge intervals.

10. The multi-voltage generation circuit of claim 9, wherein the control circuit is further configured to determine the duty cycle for each of the plurality of charge intervals based on one or more of:
the respective one of the plurality of modulated initial voltages;
the respective one of the plurality of offset voltages;
the respective one of the plurality of modulated voltages; and
the respective one of the plurality of sense currents.

11. A method for generating and maintaining multiple voltages comprising:
determining a plurality of charge intervals and a plurality of discharge intervals in each of one or more operation periods;
generating a respective one of a plurality of modulated initial voltages during a respective one of the plurality of charge intervals;
charging a respective one of a plurality of offset capacitors during the respective one of the plurality of charge intervals to a respective one of a plurality of offset voltages to thereby raise the respective one of the plurality of modulated initial voltages to a respective one of a plurality of modulated voltages; and
discharging the respective one of the plurality of offset capacitors during a respective one of the plurality of discharge intervals to maintain the respective one of the plurality of modulated voltages.

12. The method of claim 11, further comprising:
determining the plurality of charge intervals to not overlap with one another; and
determining the plurality of discharge intervals to overlap with one another.

13. The method of claim 11, further comprising:
providing the plurality of offset capacitors with an identical capacitance; and
determining the plurality of charge intervals having an identical duration.

14. The method of claim 11, further comprising:
providing the plurality of offset capacitors with different capacitances; and
determining the plurality of charge intervals having different durations.

15. The method of claim 11, further comprising:
operating based on a duty cycle to generate a low-frequency voltage as a function of a battery voltage;
inducing a low-frequency current at a common node based on the low-frequency voltage; and
determining the duty cycle for each of the plurality of charge intervals to thereby modulate the low-frequency current in each of the plurality of charge intervals.

16. The method of claim 15, further comprising:
closing a respective on-off switch during the respective one of the plurality of charge intervals to provide the low-frequency current from the common node to a respective voltage output;
closing the respective bypass switch during the respective one of the plurality of charge intervals such that the low-frequency current can charge the respective one of the plurality of offset capacitors to the respective one of the plurality of offset voltages; and
sourcing or sinking a respective high-frequency current during the respective one of the plurality of charge intervals to thereby maintain the respective one of the plurality of modulated voltages.

17. The method of claim 16, further comprising:
opening the respective on-off switch during the respective one of the plurality of discharge intervals to block the low-frequency current from flowing from the common node to the respective voltage output; and
opening the respective bypass switch during the respective one of the plurality of discharge intervals such that the respective one of the plurality of offset capacitors is discharged to maintain the respective one of the plurality of modulated voltages.

18. The method of claim 16, further comprising generating a respective one of a plurality of sense currents indicating a respective amount of the high-frequency current that is sourced/sunk during the respective one of the plurality of charge intervals.

19. The method of claim 18, further comprising determining the duty cycle for each of the plurality of charge intervals based on one or more of:
the respective one of the plurality of modulated initial voltages;
the respective one of the plurality of offset voltages;
the respective one of the plurality of modulated voltages; and
the respective one of the plurality of sense currents.

20. A multi-voltage power management circuit comprising:
a plurality of power amplifier circuits configured to concurrently amplify a plurality of radio frequency (RF) signals based on a plurality of modulated voltages, respectively; and
a multi-voltage generation circuit comprising:
a plurality of voltage modulation circuits each comprising:
a respective one of a plurality of voltage amplifiers configured to generate a respective one of a plurality of modulated initial voltages based on a respective one of a plurality of modulated target voltages; and
a respective one of a plurality of offset capacitors configured to raise the respective one of the plurality of modulated initial voltages by a respective one of a plurality of offset voltages to thereby generate a respective one of the plurality of modulated voltages; and
a control circuit configured to:
determine a plurality of charge intervals and a plurality of discharge intervals in each of one or more operation periods; and cause each of the plurality of offset capacitors to be:
  charged to the respective one of the plurality of offset voltages during a respective one of the plurality of charge intervals; and
  discharged to maintain the respective one of the plurality of modulated voltages during a respective one of the plurality of discharge intervals.

\* \* \* \* \*